(12) United States Patent
Shute

(10) Patent No.: US 9,793,858 B2
(45) Date of Patent: Oct. 17, 2017

(54) TRANSFER FUNCTION REGULATION

(71) Applicant: SnapTrack, Inc., San Diego, CA (US)

(72) Inventor: Nicholas Shute, Cambridgeshire (GB)

(73) Assignee: SnapTrack, Inc., San Diego, CA (US)

( * ) Notice: Subject to any disclaimer, the term of this patent is extended or adjusted under 35 U.S.C. 154(b) by 13 days.

(21) Appl. No.: 14/892,517

(22) PCT Filed: May 22, 2014

(86) PCT No.: PCT/EP2014/060583
§ 371 (c)(1),
(2) Date: Nov. 19, 2015

(87) PCT Pub. No.: WO2014/187920
PCT Pub. Date: Nov. 27, 2014

(65) Prior Publication Data
US 2016/0126900 A1 May 5, 2016

(30) Foreign Application Priority Data

May 22, 2013 (GB) .................................. 1309235.8

(51) Int. Cl.
*H03G 3/20* (2006.01)
*H03F 1/02* (2006.01)
(Continued)

(52) U.S. Cl.
CPC ......... *H03F 1/0211* (2013.01); *H03F 1/0222* (2013.01); *H03F 1/0227* (2013.01);
(Continued)

(58) Field of Classification Search
CPC .... H03F 1/02; H03F 2200/102; H03F 1/0222; H03F 1/0211; H03F 1/0227;
(Continued)

(56) References Cited

U.S. PATENT DOCUMENTS

| | | | |
|---|---|---|---|
| 5,144,258 A * | 9/1992 | Nakanishi | H03G 3/3078 330/129 |
| 7,805,115 B1 * | 9/2010 | McMorrow | H03F 1/0222 455/108 |

(Continued)

FOREIGN PATENT DOCUMENTS

| | | |
|---|---|---|
| CN | 1790920 A | 6/2006 |
| CN | 101247153 A | 8/2008 |
| CN | 102723915 A | 10/2012 |

OTHER PUBLICATIONS

International Search Report and Written Opinion—PCT/EP2014/060583—ISA/EPO—dated Aug. 12, 2014.

*Primary Examiner* — Khanh V Nguyen
(74) *Attorney, Agent, or Firm* — Patterson & Sheridan, L.L.P.

(57) ABSTRACT

The invention relates to a technique for controlling in an envelope tracking amplification stage, comprising: determining a representation of the output signal of the amplifier; determining a representation of the input signal of the amplifier; adjusting the determined representation of the input signal according to a target characteristic of the amplifier; comparing the adjusted input and determined representation of the output; and generating a control signal in dependence on the comparison.

10 Claims, 8 Drawing Sheets

(51) Int. Cl.
*H04L 25/03* (2006.01)
*H03F 3/19* (2006.01)
*H03F 3/21* (2006.01)

(52) U.S. Cl.
CPC ................ *H03F 3/19* (2013.01); *H03F 3/21* (2013.01); *H04L 25/03834* (2013.01); *H03F 2200/102* (2013.01); *H03F 2200/129* (2013.01); *H03F 2200/451* (2013.01)

(58) Field of Classification Search
CPC .... H03F 1/0266; H03F 1/32; H03F 2200/228; H03F 2200/504; H03F 3/04; H03G 3/20; H04B 1/0475
USPC ......................................... 330/136, 127, 297
See application file for complete search history.

(56) References Cited

U.S. PATENT DOCUMENTS

| | | | |
|---|---|---|---|
| 8,692,614 B2* | 4/2014 | Brice | .................... H03F 1/0222 330/149 |
| 8,989,682 B2* | 3/2015 | Ripley | .................. H03F 1/0227 330/131 |
| 2002/0090921 A1 | 7/2002 | Midtgaard et al. | |
| 2006/0209984 A1 | 9/2006 | Kenington | |
| 2007/0290748 A1 | 12/2007 | Woo et al. | |

* cited by examiner

TRANSFER FUNCTION REGULATION

BACKGROUND TO THE INVENTION

Field of the Invention

The present invention relates to envelope tracking power amplifiers.

Description of the Prior Art

Envelope tracking power amplifier architectures are well-known, and an example of such is shown in FIG. 1.

In FIG. 1 an input signal is provided on line 22. The input signal is provided to a transmitter RF modulator block 20 before being delivered to the input of a power amplifier 18. The power amplifier 18 provides an RF amplified version of the input signal on line 24 as an RF output signal. The transmitter RF modulator block 20 modulates the input signal and also converts the input signal into an RF signal.

The input signal on line 22 is also provided as an input to an AM (amplitude modulation) block 12, which generates at its output an envelope signal representing the envelope of the input signal. The envelope signal is processed by an envelope tracking processing block 14 before providing a control input to an envelope tracked modulator 16. The envelope tracked modulator provides a supply voltage to the power amplifier 18 under the control of the envelope tracked signal provided by the envelope tracking processing block 14.

The envelope tracked processing block 14 may comprise a delay adjustment block 26, a pre-shaping gain and offset block 28, a post-shaping gain and offset block 32 and a digital-to-analogue converter block 34. As known in the art, the envelope tracked processing block 14 typically includes shaping block, denoted by reference numeral 30 in FIG. 1.

Thus, and with reference to FIG. 2, it is known to receive an input signal to be amplified in a step 40, and to modulate that received input signal to an RF input signal in a step 42. An envelope signal may be generated for an envelope tracking modulator in a step 44. An envelope tracked supply voltage may then be generated in a step 46. The envelope tracked supply voltage is provided to the power amplifier in a step 48 as the supply voltage. The power amplifier amplifies a modulated received input signal in dependence on the envelope tracked supply voltage to the power amplifier in a step 50, and generates an RF output signal at the output of the power amplifier in a step 52.

It is an aim of the present invention to provide an improvement to an envelope tracking architecture such as set out in FIG. 1, and in particular to provide an improved technique for shaping in the envelope path.

SUMMARY OF THE INVENTION

In one aspect the invention provides a method for controlling in an envelope tracking amplification stage, comprising: determining a representation of the output signal of the amplifier; determining a representation of the input signal of the amplifier; adjusting the determined representation of the input signal according to a target characteristic of the amplifier; comparing the adjusted input and determined representation of the output; and generating a control signal in dependence on the comparison.

The target characteristic may be an AM-AM characteristic, and the control signal is an amplitude control signal, the control signal modifying a shaping function applied to the envelope signal.

The step of modifying may comprise indexing the shaping function in dependence on the input signal and applying the result of said comparison to the indexed shaping function, thereby modifying the shaping function.

The target characteristic may a PM-PM characteristic, and the control signal is a phase control signal, the control signal modifying the phase of the input signal applied to the amplifier.

The method may further comprise measuring the signal at an input to the amplification stage to determine the representation of the input signal.

The step of measuring the input signal may comprise demodulating the input signal.

The method may further comprise modulating the signal at an input to a power amplifier of the amplification stage; and measuring the input signal before the modulating step to determine the representation of the input signal.

The method may further comprise measuring the input signal in dependence on the envelope signal in the envelope path to determine the representation of the input signal.

The method may further comprise measuring the output signal by demodulating the output signal to determine the representation of the output signal.

In an aspect the invention provides an envelope tracking amplification stage including an envelope path and an input signal path, including: a target block for adjusting a representation of an input signal according to a target characteristic; and a comparator for comparing the adjusted representation of the input signal to a representation of the output signal, and for generating a control signal.

The target characteristic may be an AM-AM characteristic, and the control signal is an amplitude control signal, the envelope tracking amplification stage further including a shaping table in an envelope path, the amplitude control signal modifying a shaping function applied to the envelope signal.

The shaping table may be adjusted in dependence on a measured input signal which is used in said comparison.

The shaping table may be adjusted by adjusting a shaping function value which corresponds to a measured input signal, the adjustment corresponding to a comparison between that input signal and a corresponding output signal.

The target characteristic is a PM-PM characteristic, and the control signal is a phase control signal, the envelope tracking amplification stage further comprising an element for modifying the input signal in the input path to the amplifier and for receiving the control signal and modifying the phase of the input signal applied to the amplifier.

The input signal may be measured at the input to an amplifier of the amplification stage to provide the representation of the input signal.

The envelope tracking amplification stage may further comprise a demodulator for demodulating the input to the amplifier prior to measuring the input signal to provide the representation of the input signal.

The envelope tracking amplification stage may further comprise a modulator for the input signal, the input signal being measured at the input to the modulator to provide the representation of the input signal.

In another aspect there is provided a method for controlling an input to a modulated power supply of an envelope tracking amplification stage, comprising: applying a shaping function to an envelope signal representing a signal to be amplified; comparing input and output signals of the envelope tracking amplification stage; and modifying the shaping function applied to the envelope signal in dependence on said comparison and a representation of the input signal.

The method may further comprise adjusting the input signal in dependence on a target shaping function of the amplification stage, wherein the comparing step comprises comparing the adjusted input signal with the output signal. Thus the comparison compares the actual output signal with a target output signal, the target output signal being represented by the actual input signal adapted according to a target shaping function (if any).

The step of modifying may comprise indexing the shaping function in dependence on the input signal and applying the result of said comparison to the indexed shaping function, thereby modifying the shaping function. The indexing is based on the current input signal being amplified, and the indexing may alternatively be provided by the output signal associated with a particular input signal, or some other representation of the input signal. The indexing is required to provide an indication of the input with which the comparison is associated, but this may be provided by means other than a direct indication of the current input signal.

The method may further comprise measuring the signal at an input to the amplification stage. The step of measuring the input signal may comprise demodulating the input signal. The signal at the input to the amplification stage may be a radio frequency signal, and demodulation of this signal may be performed before measuring the signal. The signal at the input to a power amplifier of the amplification stage may require demodulation.

The method may further comprise the step of modulating the signal at an input to a power amplifier of the amplification stage; and measuring the input signal before the modulating step. The measuring of the input signal thus may require no demodulation.

The method may further comprise the step of measuring the input signal in dependence on the envelope signal in the envelope path. The envelope signal in the envelope path may thus provide a representation of the input signal.

The method may further comprise the step of measuring the output signal by demodulating the output signal. The output signal may be a radio frequency signal.

The invention also provides an envelope tracking amplification stage including an envelope path and a signal path, including a comparator for comparing an input signal and an output signal of the amplification stage, wherein a shaping function of a shaping table in the envelope path is adjusted in dependence on said comparison and a representation of the input signal.

The shaping table may be adjusted in dependence on a measured input signal which is used in said comparison.

The envelope tracking amplification stage may further comprise a target shaping block for adjusting the input signal before said comparison in accordance with a target shaping function for the amplification stage.

The shaping table may be adjusted by adjusting a shaping function value which corresponds to a measured input signal, the adjustment corresponding to a comparison between that input signal and a corresponding output signal.

The input signal may be measured at the input to an amplifier of the amplification stage.

The envelope tracking amplification stage may further comprise a demodulator for demodulating the input to the amplifier prior to measuring the input signal.

The envelope tracking amplification stage may further comprise a modulator for the input signal, the input signal being measured at the input to the modulator.

BRIEF DESCRIPTION OF THE FIGURES

The invention is now described by way of example with reference to the accompanying Figures, in which.

DESCRIPTION OF THE PREFERRED EMBODIMENTS

The invention is now described by way of example with reference to particular embodiments and exemplary implementations. The invention is not limited to the details of any described embodiments or exemplary implementations.

In general the invention provides a method of regulating the power amplifier or transmitter AM (amplitude modulation) transfer function to a desired target AM transfer function.

Figure 3:
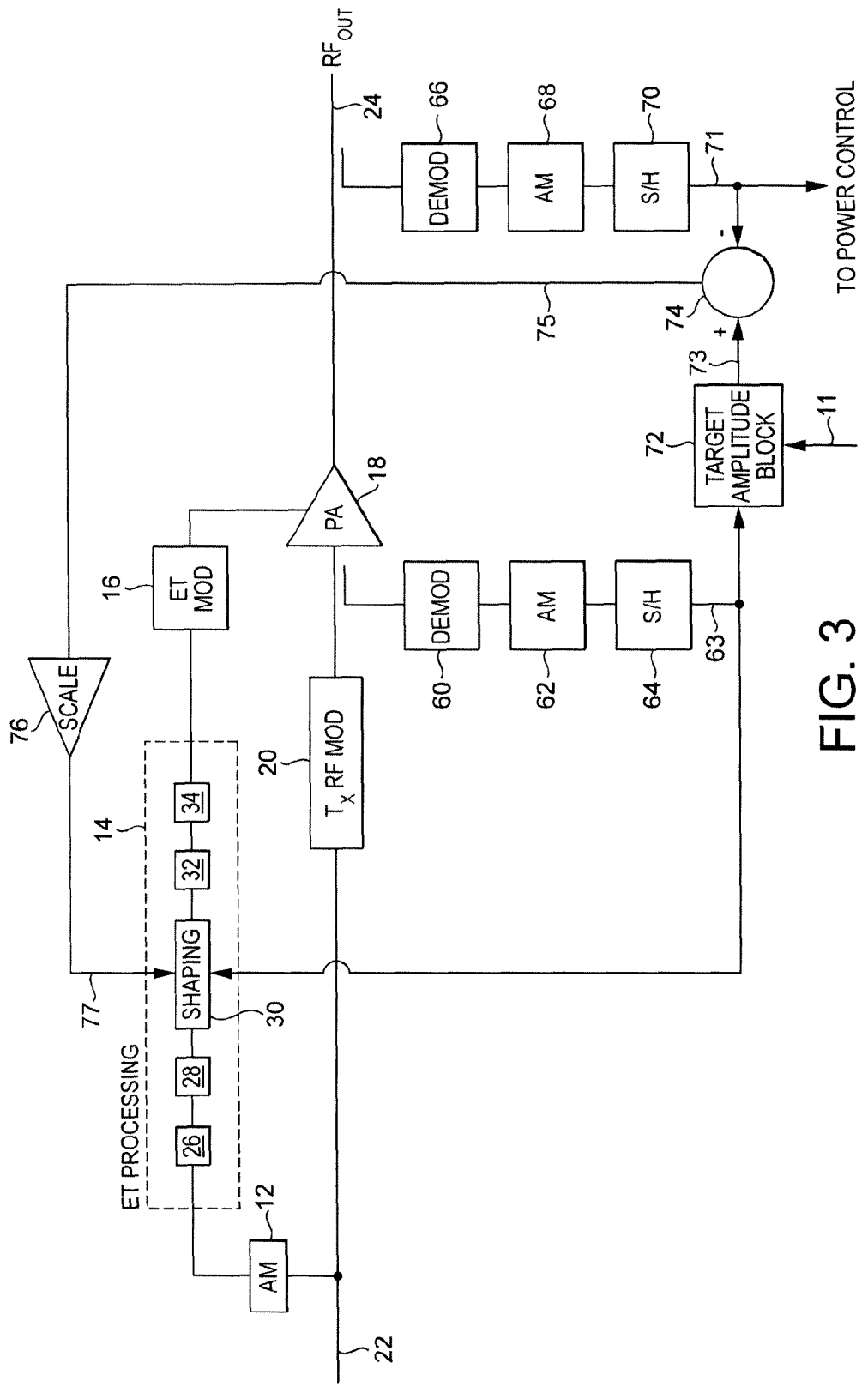
FIG. 3 illustrates a first exemplary improved envelope tracking power amplifier architecture in which an amplitude control signal is generated.
Figure 5:
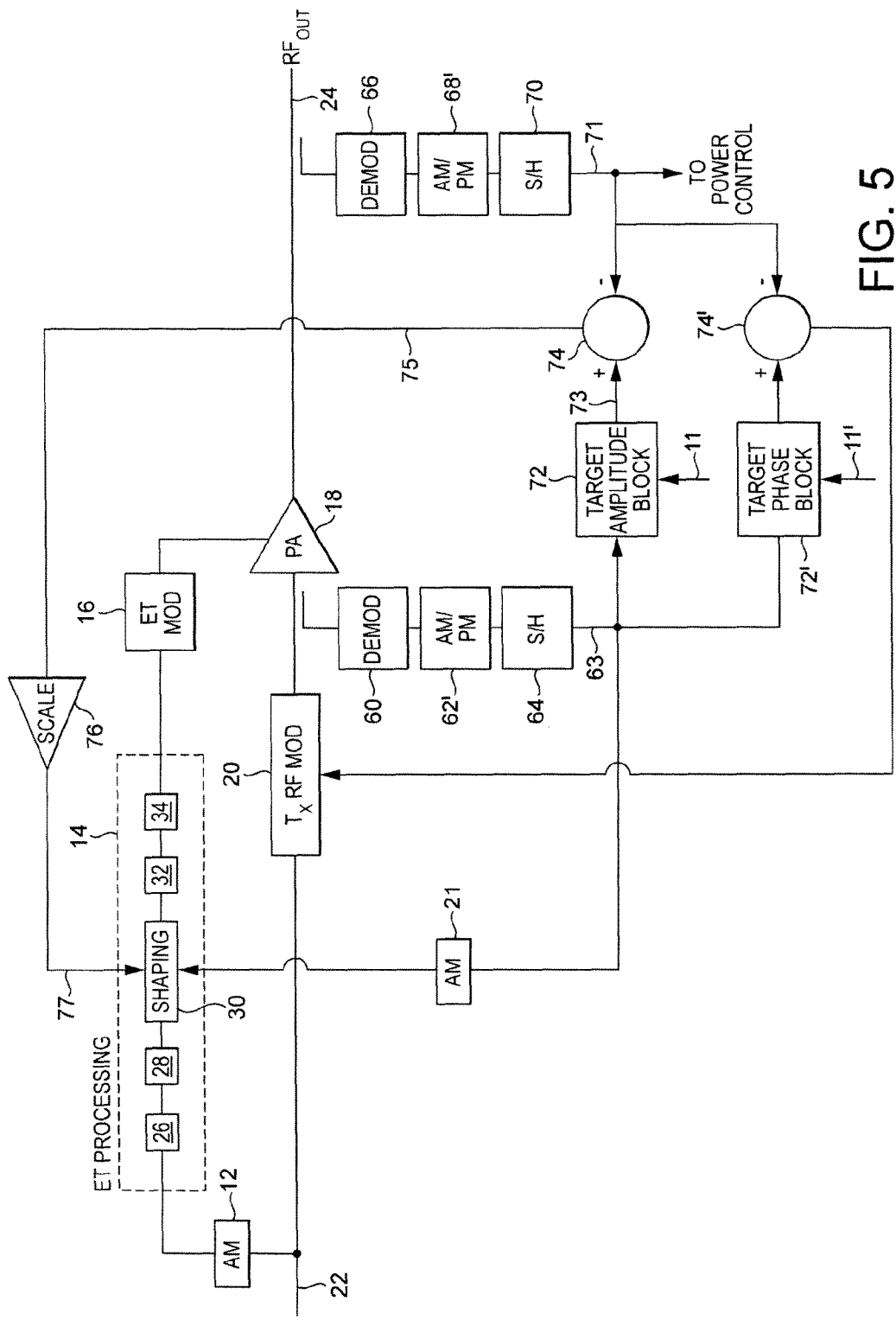
FIG. 5 illustrates a second exemplary improved envelope tracking power amplifier architecture in which an amplitude control signal and a phase control signal are generated.

FIG. 3 shows an exemplary arrangement in which the power amplifier transfer function is regulated, and FIG. 5 shows an exemplary arrangement in which the transmitter transfer function is regulated. In this context the term 'transmitter' means the combination of the transmitter RF modulator block 20 and the power amplifier 18.

Where elements in any Figure correspond to elements shown in a previous Figure like reference numerals are used.

FIG. 3 illustrates an implementation of an exemplary circuit in accordance with a first exemplary arrangement.

The arrangement of FIG. 3 adapts the envelope tracking path in which shaping occurs such that the shaping is based on an error measurement between the actual power amplifier transfer function and a target power amplifier transfer function.

Although in the Figures shaping is based on a difference due to an error, and a difference is described herein, in practice the shaping can be based on any comparison between the signals. This may be a measure, for example, such as a correlation or a ratio, rather than an error.

Figure 1:
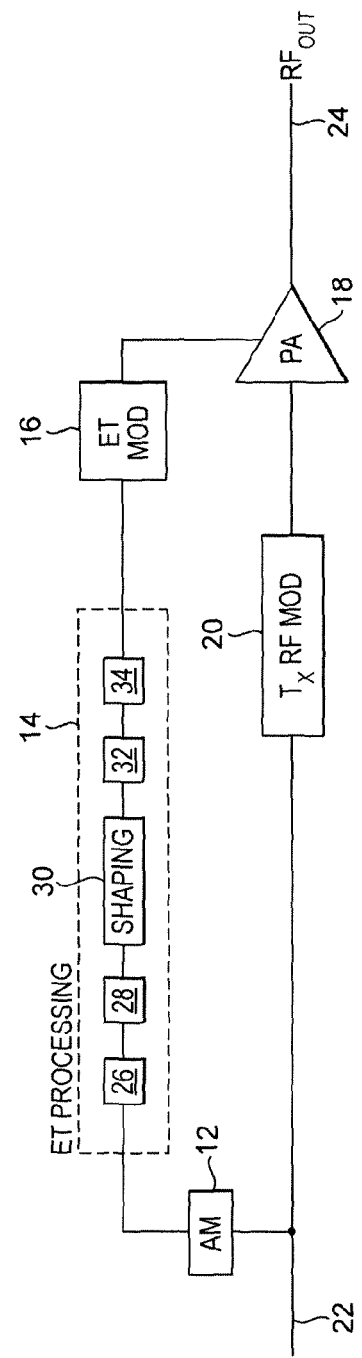
FIG. 1 illustrates an envelope tracking power amplifier architecture in accordance with the prior art.
Figure 2:
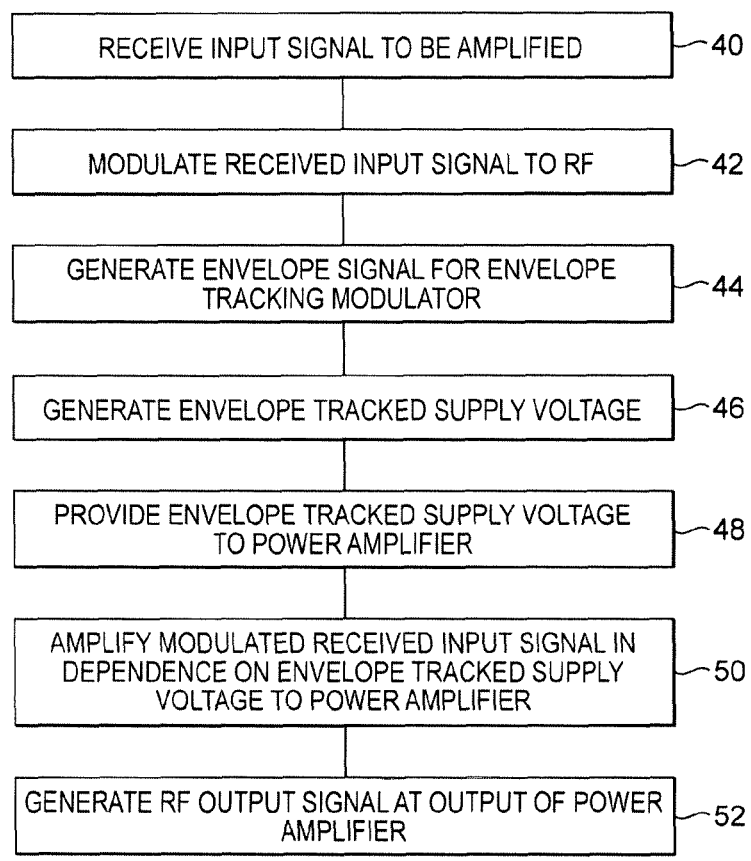
FIG. 2 illustrates a method associated with the architecture of FIG. 1.

The envelope tracking architecture of FIG. 3 corresponds to that of FIG. 1 but with the addition of demodulator blocks 60 and 66, AM blocks 62 and 68, S/H (sample and hold) blocks 64 and 70, a target amplitude block 72, an error measurement or comparison block 74, and a scaling block 76.

The RF output signal on line 24 is detected by the demodulator 66, and the demodulator 66, AM block 68, and S/H block 70 operate to provide a signal on line 71 which is a digital representation of the envelope of the RF output signal on line 24. The generation of such a signal on line 71 representing the output of the power amplifier is not dependent on a specific implementation.

Similarly the demodulator block 60 receives the RF input signal at the input to the power amplifier 18, and the demodulator block 60, the AM block 62, and S/H block 64 produces a signal on line 63 which is a digital representation of the envelope of the RF input signal to the power amplifier 18. The generation of such a signal on line 63 representing the input to the power amplifier is not dependent on a specific implementation.

The measure of the power amplifier's input envelope signal on line 63 is also provided as an input to a target amplitude block 72.

The target amplitude block is adapted to store a target AM-AM characteristic. The target amplitude block 72 produces a power amplifier AM output on line 73 which is the actual input envelope to the power amplifier adjusted by this target AM-AM characteristic. The target amplitude block 72 thus provides a signal on line 73 which is a function of the signal on line 63, being the envelope of the RF input signal applied to the power amplifier 18.

This AM-AM characteristic of the target amplitude block 72 is the ideal AM-AM characteristic of the amplification stage, and is provided to apply to the representation of the input signal on line 63 the AM-AM characteristic which it is desired to be applied by the amplifier 18 in order to meet a target AM-AM characteristic of the amplification stage.

The AM-AM characteristic of the amplification stage is achieved by the shaping table 30 in the envelope path shaping the supply signal to the amplifier 18, so that the amplifier 18 provides an amplified output signal which meets the desired AM-AM characteristic. The shaping table in the envelope path applies shaping until the target AM-AM characteristic is met.

The target amplitude block 72 applies, to the measured input signal on line 63, the ideal or desired AM-AM characteristic, so the representation of the input signal on line 73 is shaped accordingly to the ideal AM-AM characteristic. This means that the subsequent comparison of the input signal to the output signal takes into account the shaping control of the envelope path in controlling the AM-AM characteristic of the amplifier 18.

The AM-AM characteristic can be as simple as a linear gain characteristic, or something more elaborate which may control system level parameters such as efficiency, linearity or wideband noise. For example a reduction in, and regulation of, peak levels may be applied, which allows a reduction in size of the power amplifier and provides an efficiency benefit, or the lower end of the shaping table may be adjusted which can control wideband noise levels across changes in power amplifier (PA) characteristics due to, for example, temperature shifts.

A control signal on line 11 provides the control to the target amplitude block 72 to set the target AM-AM characteristic. The control signal on line 11 may be the system parameters or objectives, and the target amplitude block 72 may apply these parameters, for example to a look-up-table (LUT) or using an algorithm, to determine the target AM-AM characteristic. Alternatively the control signal on line 11 may be the target AM-AM characteristic.

The error measurement or comparison block 74 receives two input signals, one being the actual envelope of the input to the power amplifier with an ideal or target AM-AM characteristic applied thereto by the target amplitude block 72 on line 73, and the other being the actual envelope of the output power amplifier on line 71.

The error measurement or comparison block 74 compares these two envelope signals, and the output of the error measurement block on line 75 is provided to the input of the scale block 76. The output of the error measurement or comparison block 74 on line 75 is, in this embodiment, the error between the two signals at its inputs.

The scale block 76 is preferably an amplifier or attenuator which scales the signal being applied to it, and delivers a control input on line 77 to the shaping block.

Thus the shaping block 30 additionally receives a signal on line 77 which is generated in dependence upon a comparison of the actual output signal and the actual input signal adjusted by the ideal AM-AM characteristic of the amplifier, which signal on line 77 represents an error.

The signal on line 63 is also provided directly to a write-indexing port of shaping block 30, and informs the shaping block 30 of the address or index which should be updated. The signal on line 77 is the error value which should be applied in the update, and the signal on line 63 is the address or index of the shaping block 30 which should be updated.

In the examples, the index to the shaping function is provided by the input signal which is also used in the comparison. However in embodiments the same input signal may not be used: the index in general is provided by a signal representing the input signal used in the comparison. The output signal is a representation of the input signal, for example, and representations of the input signal may be provided at other points and by other signals.

The shaping table stores a function for a particular input (index), and this input (index) is updated or modified based on the determined error.

The shaping block 30 has four ports in accordance with the described arrangements. Two ports are the inputs and outputs of the shaping block; the shaping block 30 receives an input, applies a shaping function to this input, and then generates an output being the input with the shaping function applied (the shaped input).

The third port is connected to the signal on line 63, and may index the shaping table to select a particular shaping function for the current input. In a preferred arrangement, there is one shaping table with one shaping function, which is adapted on a point-by-point basis. That is, line 3 selects the point (or index) within the shaping table to be updated, and the new value for that particular point is given by the correction value on line 77.

The fourth port is the error signal on line 77, representing the correction to be made to a selected shaping function.

The shaping block 30 is thus adapted such that it applies a shaping function to an envelope signal based on the error determined from this comparison and based on the actual input signal detected.

Figure 4:
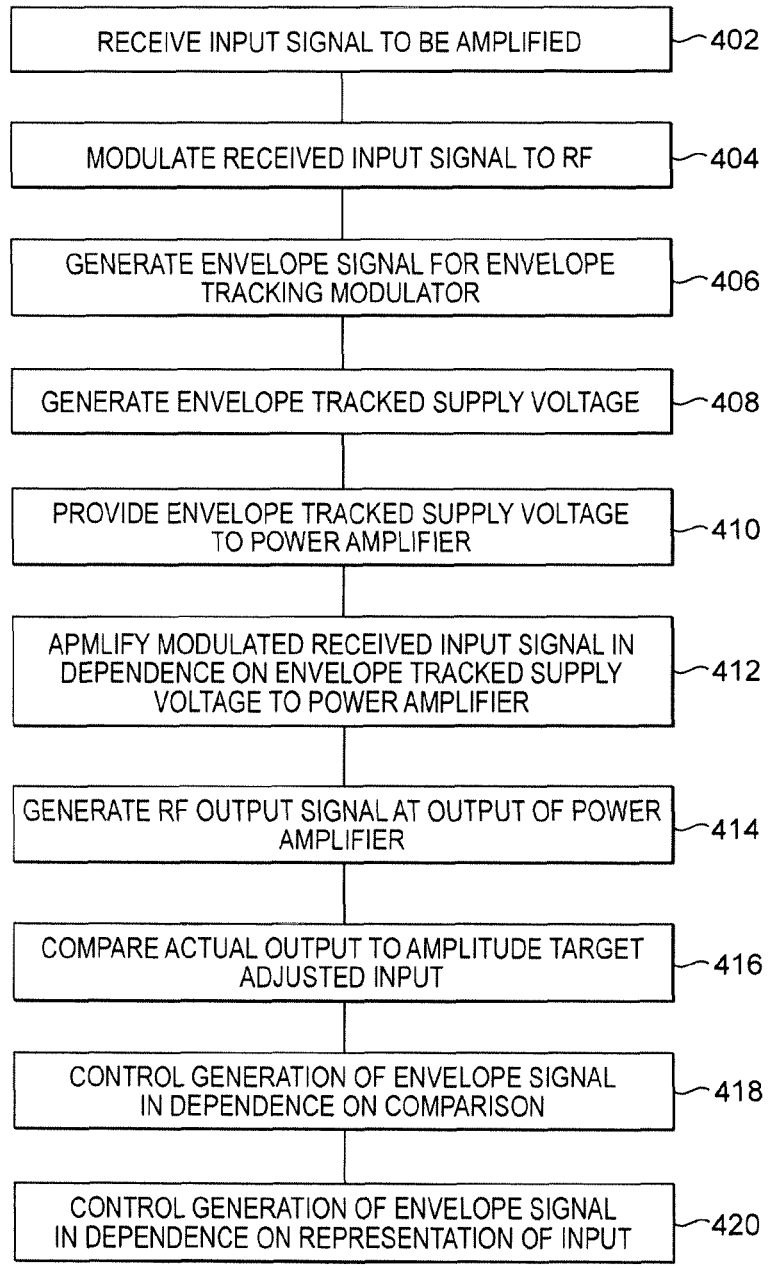
FIG. 4 illustrates a method which may be applied to the improved architecture of FIG. 3.

The operation of the circuitry of FIG. 3 is summarised in the flow process of FIG. 4.

An input signal to be amplified is received as denoted by step 402, and the input signal is modulated to RF as denoted by step 404. An envelope signal is generated for an envelope tracking modulator in step 406. An envelope tracked supply voltage is generated in step 408. An envelope tracked supply voltage is then provided to the power amplifier in a step 410. The received input signal is then amplified in dependence on the envelope tracked supply voltage to the power amplifier in step 412, and an output signal is generated at the output of the power amplifier in step 414.

In a step 416 a comparison is made between the actual output signal and the amplitude target adjusted input signal of the power amplifier. In step 418 the generation of the envelope signal, is controlled in dependence upon this comparison. In step 420 the generation of the envelope signal is also controlled in dependence upon the current input signal which determines the shaping function to update.

The shaping block receives the error correction signal on line 77, and additionally receives the representation of the input signal on line 63. The shaping function thus knows the particular input signal index to which the error correction is to be applied.

The error signal is a function of the AM input level and this has two potential advantages.

Firstly it is not necessary to update the shaping table in real time. This significantly lowers the update bandwidth and the update measurement of requirement.

In a practical implementation, the speed of the update is determined by the optional sample and hold blocks.

As an example, the shaping function may be tracked very slowly to provide a tracking of changes in temperature.

Secondly it is easy to index or refer to the correct envelope tracking path shaping table index when applying updates. The representation of the input signal on line 63 provides this index.

The closed loop correction of the envelope tracking path shaping function based on this difference to obtain desired power amplifier transfer function is advantageous.

In general, the error signal is based on comparing the output and shaped input signals, and any characteristic of these signals may be compared, such as the amplitude (as represented by envelope signals) of the signals or the power of the signals.

The exemplary arrangement of FIG. 3 can be further modified to provide a further exemplary arrangement. As described above, FIG. 3 discloses an arrangement in which a an amplitude control signal is generated by comparing a copy of the output signal with a representation of the input signal, the representation of the input signal being adjusted in accordance with a target AM-AM characteristic. In this further exemplary arrangement, a phase control signal is generated by comparing a representation of the output signal with a representation of the input signal, the representation of the input signal being adjusted in accordance with a target PM-PM characteristic.

In the described exemplary arrangement the generation of the phase control signal is shown in combination with the generation of the amplitude control signal. In practice, either one or both control signals may be generated.

FIG. 5 illustrates the arrangement of FIG. 3 with further modifications made. The elements of FIG. 5 that correspond to those of FIG. 3 are not described again, as they correspond to the described elements of FIG. 3.

In FIG. 5 the arrangement of FIG. 3 is further modified by inclusion of a comparison block 74' and a target phase block 72'. The AM block 62 of FIG. 3 is modified to be an AM/PM block 62', and the AM block 68 of FIG. 3 is modified to be an AM/PM block 68'.

The target phase block 72' receives a control signal on line 11', which is preferably the target PM-PM characteristic for the amplification stage. The target phase block 72' thus applies the target PM-PM characteristic to the input signal on line 63, and the comparison block 74' compares this with the representation of the output signal on line 71. The target phase block 72' looks at the PM information in the signal on line 63 only, and the target amplitude block 72 looks at the AM information in the signal on line 63 only.

The output of the comparison block 74' is provided as an input to the transmitter RF modulator block 20, to adjust the phase of the input signal to the amplifier in dependence on the comparison.

The adjustment of the AM blocks 62 and 68 to AM/PM blocks 62' and 68' allows the phase of the respective signals to be included and compared in the comparator 74'.

FIG. 5 further modifies the arrangement of FIG. 3 by introducing an AM block 21 at the input port to the shaping block 30 from signal line 30. The 'write indexing port' of the shaping block 30 in the ET path receives an AM indexing signal, and this the AM block 21 derives the AM content only of the signal on line 63 for application to the shaping block 30.

Figure 6:
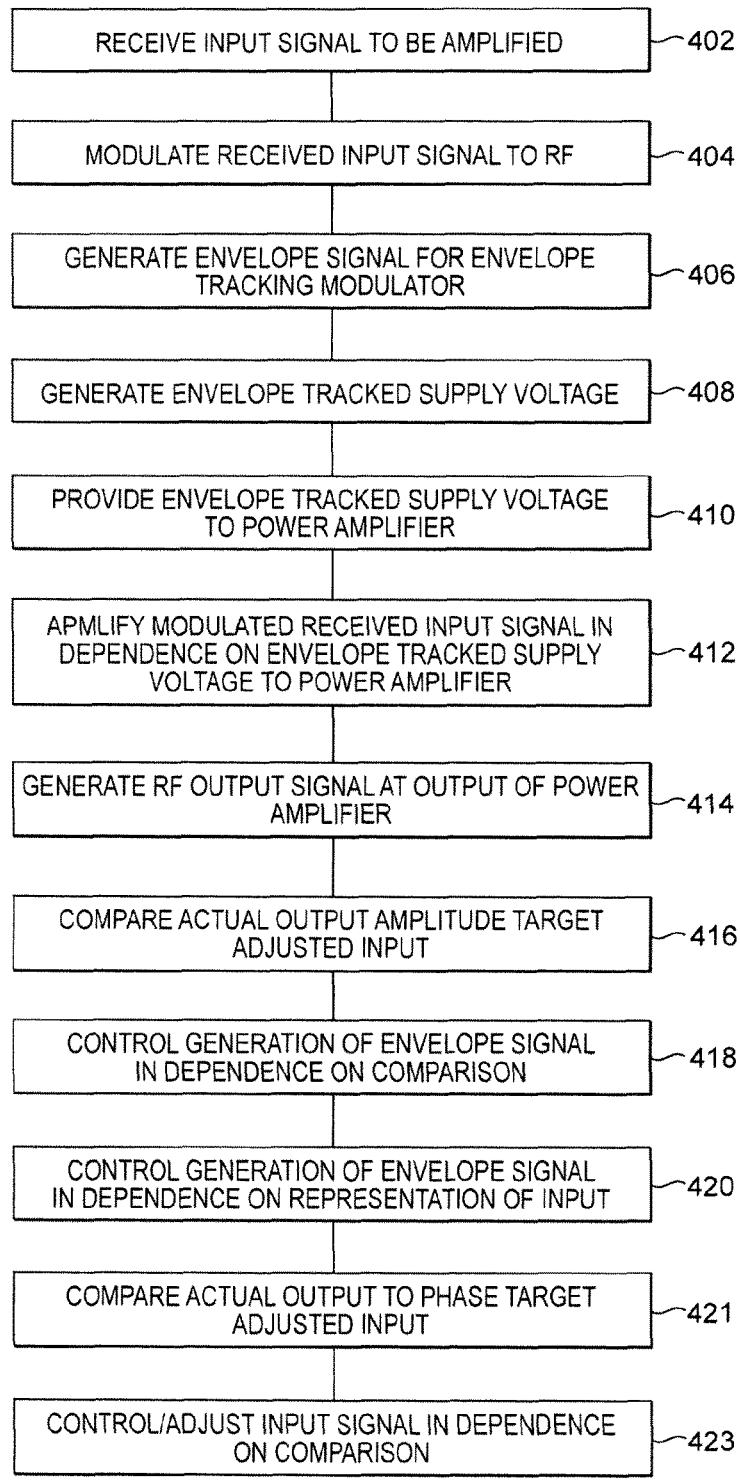
FIG. 6 illustrates a method which may be applied to the improved architecture of FIG. 5.

The operation of the circuitry of FIG. 5 is summarised in the flow process of FIG. 6. FIG. 6 correspond to FIG. 4, with additional steps 421 and 423. In step 421 a comparison is made between the actual output signal and the target phase adjusted input signal of the power amplifier. In step 423 the input signal to the power amplifier is adjusted in dependence on that comparison.

FIG. 3 illustrates a first exemplary arrangement in which an amplitude control signal is generated, and FIG. 5 illustrates a second exemplary arrangement in which additionally a phase control signal is generated. As mentioned above, the amplitude and phase control signals can both be generated, or in implementations only one of these signals may be generated.

Figure 7:
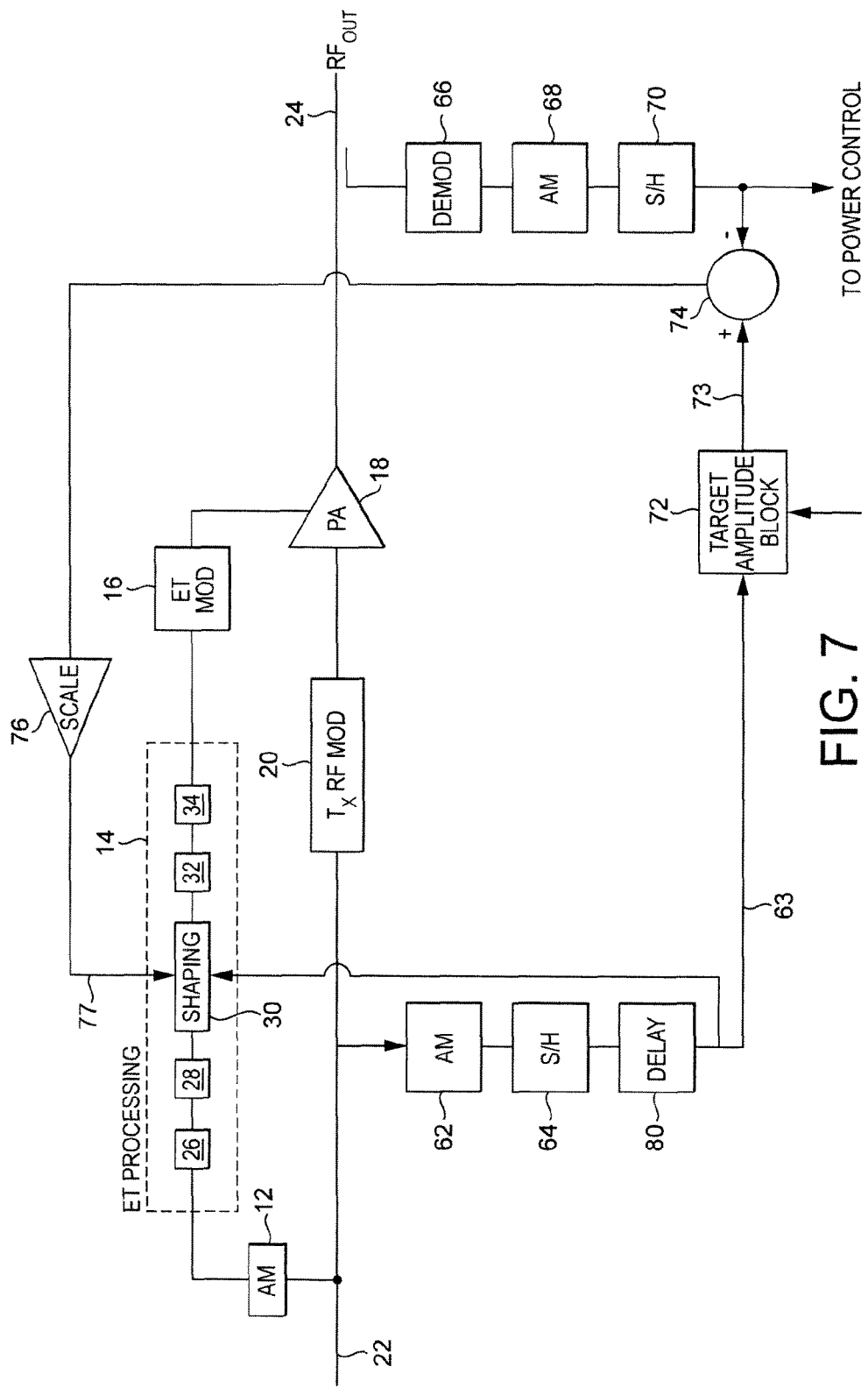
FIG. 7 illustrates a third exemplary improved envelope tracking power amplifier architecture in which an amplitude control signal is generated.

FIG. 7 illustrates the arrangement of an exemplary circuit in accordance with a third exemplary arrangement, based on the first exemplary arrangement of FIG. 3.

In this alternative arrangement of FIG. 7 the transmitter transfer function is corrected rather than the power amplifier transfer function as in FIG. 3. As mentioned above, in this context the 'transmitter' means the combination of the transmitter RF modulator block and the power amplifier.

As can be seen in the exemplary arrangement of FIG. 7, there is provided circuitry similar to that of FIG. 3. However an input is taken from the input to the transmit RF modulator block 20 rather than the input to the power amplifier 18. As such, the demodulator 60 of FIG. 3 is not required; the AM block 62 receives the input on line 22 directly, and provides this to the sample-and-hold block 64. Note that the output of the AM block 12 could also be used instead of the AM block 62 in FIG. 7. The output of the sample-and-hold block 64 is applied to a delay block 80. The delay block 80 is provided to compensate for delay due toy the transmit RF modulator block 20, and to align the timing of the two input signals of the error measurement or comparison block 74. The output of delay block 80 is provided on line 63 as the input to the write-indexing port of the shaping table 30, and also as the input to the target amplitude block 72 which stores the target AM-AM characteristic, consistent with the arrangement of FIG. 3.

The arrangement of FIG. 7 is otherwise consistent with the arrangement of FIG. 3, and merely illustrates an arrangement in which the performance of the entire transmitter is corrected rather than the performance of the power amplifier alone. By choosing this correction method, no RF down-conversion or analogue-to-digital conversion process is required on the input side of the power amplifier.

Figure 8:
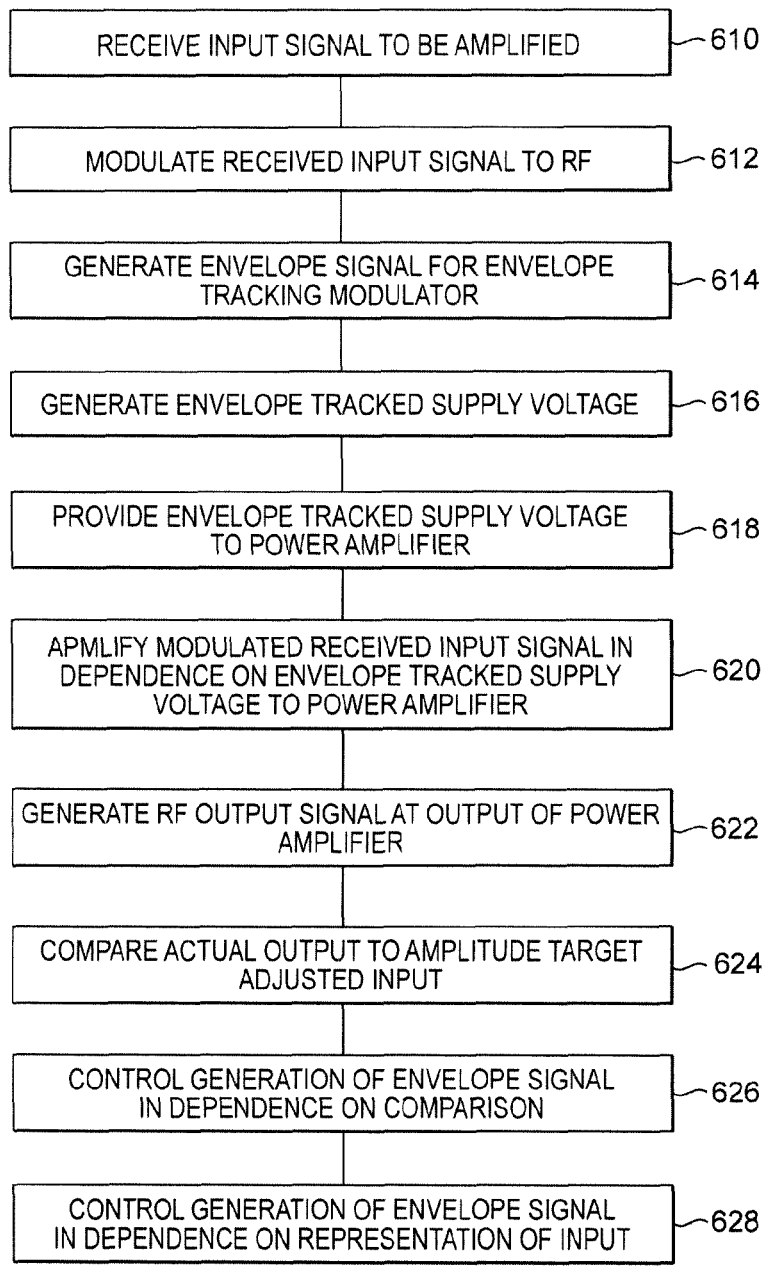
FIG. 8 illustrates a method which may be applied to the improved architecture of FIG. 7.

The operation of the arrangement of FIG. 7 is set out in the process of FIG. 8. An RF input signal to be amplified is received in a step 610, and in a step 612 this received input signal is modulated to RF. An envelope signal is generated for the envelope tracking modulator in step 614, and then a tracked supply voltage is generated in dependence upon this envelope signal in step 616. The envelope tracked supply voltage is provided to the power amplifier in step 618. The received input signal is then amplified in dependence on the envelope tracked supply voltage to the power amplifier in step 620. In a step 622 the RF output signal is generated at the output of the power amplifier.

In a step 624 there is made a comparison between the actual output signal) and the amplitude target adjusted input signal of the amplifier based on the input signal. In a step 626 the generation of the envelope signal is controlled in dependence upon this comparison, and as illustrated by step 628 the control of this envelope signal is also achieved in dependence on the input signal.

As will be understood from the arrangements of FIGS. 3 and 7, a similar approach is preferably taken whether it is desired to regulate the power amplifier or the transmitter transfer function.

Although no generation of a phase control signal, in accordance with technique of FIG. 5, is shown in FIG. 7, it will be apparent that the exemplary arrangement of FIG. 7 may be adapted to generate a phase control signal as shown in FIG. 5.

An objective of the described arrangements may be to regulate the linearity of the power amplifier due to shifts in the power amplifier, characteristic across temperature or time. Additionally, it may be desired to regulate the transfer function to one which maintains a level of linearity whilst limiting the swing range of the envelope tracking path.

Another example of possible use of the described arrangements is to update the power amplifier characteristics versus target output power level, for example to maintain a constant peak-to-average of the power amplifier output signal across a power level.

There are potentially many uses for the system proposed herein, and the transfer target function is not specified herein. The target transfer function is described as a generic 'target shaping' block which may be set depending on the performance requirement of the end product. One skilled in the art will understand implementation examples for setting the transfer target function.

The invention has been described herein with reference to particular advantageous embodiments and exemplary implementations. The invention is not limited to any details of any aspect of such embodiments and implementations. The scope of the invention is defined by the appended claims.

The invention claimed is:

1. A method for controlling in an envelope tracking amplification stage comprising an amplifier, the method comprising:
    determining a representation of an output signal of the amplifier;
    determining a representation of an input signal of the amplifier;
    adjusting the determined representation of the input signal according to a target characteristic of the amplifier;
    comparing the adjusted representation of the input signal and the determined representation of the output signal; and
    generating a control signal based on the comparison,
    wherein at least one of:
        the target characteristic is an AM-AM characteristic, the control signal is an amplitude control signal, and the control signal modifies a shaping function applied to an envelope of the input signal, or
        the target characteristic is a PM-PM characteristic, the control signal is a phase control signal, and the control signal modifies a phase of the input signal.

2. The method of claim 1, wherein modifying the shaping function comprises indexing the shaping function based on the input signal and applying a result of the comparison to the indexed shaping function.

3. The method of claim 1, further comprising:
    measuring the input signal at an input to the amplifier to determine the representation of the input signal.

4. The method of claim 3, wherein measuring the input signal comprises demodulating the input signal.

5. The method of claim 1, further comprising:
    modulating the input signal at an input to the amplifier; and
    measuring the input signal before modulating the input signal to determine the representation of the input signal.

6. The method of claim 1, further comprising:
    measuring the output signal by demodulating the output signal to determine the representation of the output signal.

7. An envelope tracking amplification stage comprising an envelope path and an input signal path, the envelope tracking amplification stage comprising:
    a target block configured to adjust a representation of an input signal of an amplifier according to a target characteristic of the amplification stage; and
    a comparator configured to compare the adjusted representation of the input signal to a representation of an output signal of the amplifier, and configured to generate a control signal based on the comparison,
    wherein at least one of:
    the target characteristic is an AM-AM characteristic, and the control signal is an amplitude control signal, the amplitude control signal being configured to modify a shaping function applied to an envelope of the input signal, or
    the target characteristic is a PM-PM characteristic, the control signal is a phase control signal, the envelope tracking amplification stage further comprising an element configured to modify the input signal in the input path to the amplifier, receive the control signal, and modify the phase of the input signal.

8. The envelope tracking amplification stage of claim 7, wherein modifying the shaping function comprises indexing the shaping function based on the input signal and applying a result of the comparison to the indexed shaping function.

9. The envelope tracking amplification stage of claim 7, wherein the input signal is measured at an input to the amplifier to determine the representation of the input signal.

10. The envelope tracking amplification stage of claim 7, wherein the input signal is measured at an input to a modulator to determine the representation of the input signal.

* * * * *